United States Patent [19]

Beal

[11] 3,767,839

[45] Oct. 23, 1973

[54] PLASTIC MICRO-ELECTRONIC PACKAGES

[75] Inventor: Jack L. Beal, Saratoga, Calif.

[73] Assignee: Wells Plastics of California, Inc., Sunyvale, Calif.

[22] Filed: June 4, 1971

[21] Appl. No.: 150,129

[52] U.S. Cl. ...... 174/52 S, 174/DIG. 3, 174/DIG. 5, 174/52 PE, 18/36, 174/15 R

[51] Int. Cl. ............................................ H05h 9/02

[58] Field of Search ...................... 174/DIG. 3, 52 S, 174/52 PE; 317/101 CP, 100; 317/234 A, 234 E, 234 F

[56] References Cited

UNITED STATES PATENTS

| | | | |
|---|---|---|---|
| 3,340,347 | 9/1967 | Spiegler | 174/DIG. 3 UX |
| 3,484,533 | 12/1969 | Kauffman | 174/52 S |
| 3,509,430 | 4/1970 | Mroz | 174/52 S X |
| 3,646,409 | 2/1972 | Van de Water et al. | 174/DIG. 3 X |
| 3,290,564 | 12/1966 | Wolff, Jr. | 317/234 A X |
| 3,627,901 | 12/1971 | Happ | 174/DIG. 3 X |
| 3,629,668 | 12/1971 | Hingorany | 174/DIG. 3 X |

*Primary Examiner*—Darrell L. Clay
*Attorney*—Townsend & Townsend

[57] ABSTRACT

A rugged stable component housing is provided, for mounting a microelectronic device and hermetically sealing the area enclosing the device. A lead frame is mounted onto a base, and a dielectric body moulded onto the lead frame, bonding the lead frame to the base and providing a nest area. The nest area has the internal tips and the pad, if any, of the lead frame uncovered by the dielectric material. After mounting the microelectronic device, the nest area is hermetically sealed with a lid bonded to the dielectric body.

10 Claims, 9 Drawing Figures

INVENTOR.
JACK L. BEAL
BY
Townsend and Townsend
ATTORNEYS

PLASTIC MICRO-ELECTRONIC PACKAGES

BACKGROUND OF THE INVENTION

1. Field of the Invention

Improved, more efficient ways are continuously being sought to provide component housings for microelectronic packages. The component housing is devised to fulfill a plurality of functions. The housing provided a protective support for a microelement, such as a semiconductive chip, so as to protect the microelement from contamination and oxidation. Further, in many instances, it is desirable that the housing provide rapid and effective dissipation of heat. In addition, the housing provides mechanical strength for the microelement and ease of manipulation for connecting the microelement in a circuit without damage to the microelement.

Numerous techniques and materials have been used to provide component housings. Many of these materials are difficult to work with, such as ceramics, or the housings are only inconveniently assembled and hermetically sealed.

2. Description of the Prior Art

U. S. Pat. Nos. 3,025,437, 3,190,952, 3,195,026, 3,220,095, 3,222,450 and 3,312,771 disclose a variety of hermetically sealed housings for microelectronic devices. U. S. Pat. No. 3,509,430 discloses a housing employing a lead frame, using a eutetic member for hermetic sealing.

SUMMARY OF THE INVENTION

A conveniently assembled component housing is provided employing a mildly deformable electrically insulated base member, preferably heat conducting, a lead frame bonded to said base member with an encapsulating composition, which fills the interstices between the leads and forms a seat for placement of a lid, the internal tips of the leads surrounding an area for placement of the microelectronic device.

The top portion of the internal lead tips is left uncovered by the encapsulating compound to provide an area for electrical connection to the microelectronic device. Optionally, a portion of the encapsulating composition is metalized to enhance the protective properties of the hermetic seal. The base member has a positioning member, so as to provide for accurate positioning of the lead frame and base member in the mold.

DESCRIPTION OF THE SPECIFIC EMBODIMENTS

Figure 1:
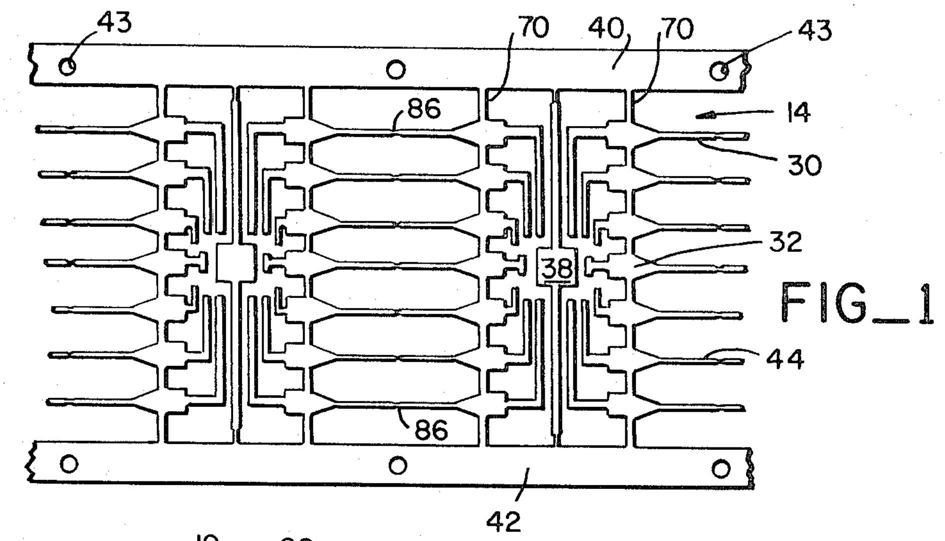
FIG. 1 is a plan view of a lead frame strip, with two lead frames being shown.

The subject invention provides a component housing which is conveniently and efficiently assembled permitting accurate placement of a microelectronic device positioned among a plurality of leads. The leads are positioned in juxtaposition to the microelectronic device to be easily and readily connectible.

The component housing has four elements: a base or insert member; a lead frame; a molded encapsulating member; and a lid. The combination of the four elements results in a compact housing which provides the necessary protection for a microelectronic device from contamination and oxidation. Furthermore, rigidity is supplied to the microelectronic device for easy manipulation and connection into a circuit. The materials and design employed are those which will permit, if required, rapid heat dissipation from the microelectronic device; reduced attenuation of ultrasonic energy, commonly used in lead attachment, through employment of a rigid support of the lead frame bonding pads; and protection against electrical shorts. Where heat dissipation is not a factor, poor thermal conductors may be used as inserts e.g. glass filled epoxy laminate.

The design of the various parts of the component housing permits easy and efficient organization of the parts in relation to each other so as to provide accurate positioning and excellent planarity of the die bonding pads located on the lead frame; the package configuration allows mold "shutoff" in critical areas of die bonding. No encapsulating composition flash results to impair bonding; by chamfering the inner wall of the encapsulating component, entry with bonding tools is simplified; and, the encapsulant barrier around the lead frame pad areas eliminates electrical shorts occurring during die attach operations.

In manufacturing the housing, the lead frame is placed on a base plate. The base plate supports only a portion of the area of the lead frame, permitting the leads to extend beyond the base plate for easy connection. An encapsulating composition is then molded on top of the lead frame, and, depending on the size of the base, around the base. The encapsulant is forced down between the various leads to provide stabilization and insulation of the leads, giving rigidity to the entire structure. When a pad is present, the pad is forced by the mold die into the base plate and held in the base plate by encapsulating material. Usually, a cavity is provided for the pad, having a depth at least about equal to the thickness of the pad. The lead frame pad is therefore rigidly held in position by the bed in the base plate, as well as by encapsulant. The encapsulant mold die prevents encapsulant from coating the top of the tips of the leads in the area of the pad, as well as on the top of the pad, and forces the pad into the cavity.

If desired, the molded encapsulant body may now be metalized to enhance the ease and properties of the sealing to the lid. Also, the area around the lead exits may be metalized so as to improve the moisture barrier. However, metalization is not necessary and various other methods of sealing may be employed. The pad may be modified with various materials to provide for device or chip attachment to the pad. The microelectronic device is positioned on the pad, and connected to the lead tops by any convenient electrical connection means, e.g. gold or aluminum wire. The lid is then placed over the central opening, positioned on the encapsulant body and sealed thereto.

Figure 4:
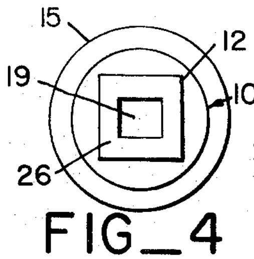
FIG. 4 is a plan view of a base.
Figure 2:
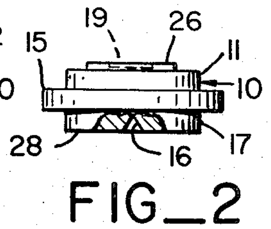
FIG. 2 is a side view of a base.
Figure 7:
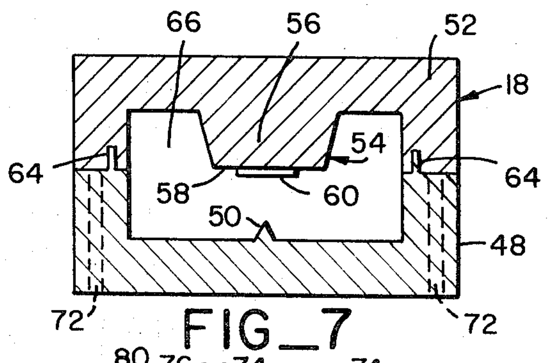
FIG. 7 is a cross-sectional view of a mold for molding the component housing.
Figure 3:
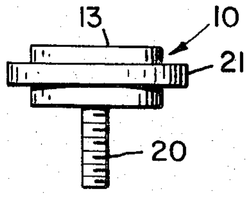
FIG. 3 is a side view of another embodiment of a base.

The base plate 10 is indicated in FIGS. 2, 3, and 4. The base plate need not have any particular shape, although certain shapes are preferable to others. The base plate 10 should have some means associated with the molding die for positioning the base plate in the die. Second, the base plate should have an irregularity or architectural feature which will lock the base plate in position during the molding, so as to prevent any movement of the base plate, once the encapsulant has hardened, in either the vertical or horizontal direction.

The base plate may be rectangular, e.g. a regular parallelopiped, cylindrical, truncated conical, stepped cylindrical, etc. The shape should be convenient for positioning in the molding die, and large enough to provide for the desired heat dissipation and for the support of the internal tips of the lead frame. Conveniently, the base plate will usually be from about 3/16th to 1 inch in its largest dimension, more usually ¼th to ¾th inch in its largest dimension. Most conveniently, the base plate is a stepped cylinder as depicted in FIGS. 2, 3 and 4.

The base plate 10 may have a rectangular platform 12 or a flat surface 13. The rectangular platform provides an irregularity which locks the base plate into a particular position in the housing, preventing any rotation, and provides a convenient location for positioning of the lead frame 14. The base plate has a central expanded cylindrical portion 15 which locks the insert in the vertical direction, and upper 11 and lower 17 cylinders of smaller diameter. The base plate 10 has a pyramidal indentation 16, which provides a means for positioning the base plate 10 in the mold die 18. The pyramid which provides both location and directional positioning is only necessary when a pad or other feature which must be oriented is present. With a pad 38, the pad must be oriented with the cavity 19 in the mold.

Other means may be used in conjunction with the mold die, such as a stud 20, as indicated in FIG. 3. The stud 20, can be threaded, so as to mount a heat dissipating housing 22, having a plurality of cooling flanges 24. The stud 20 can be used for mounting the component in a plate or housing, where the plate or housing could act as a heat dissipator. If required, a locating feature can be provided for the stud 20 to serve the same function as the pyramidal indentation 16. However, the base 21 with the stud is shown for use with a lead frame without a pad. That is, the base has no cavity on its upper surface.

The base plate can be of any convenient material which is either a good or poor heat conductor, depending on the requirements, is capable of mild deformation under an applied force, but otherwise rigid, and can be electrically insulated from the lead frame 14. The base plate must have sufficient rigidity at a thickness of about 0.015 inches and yet be deformable under relatively mild pressures. The base plate is usually of from about 0.03 to about 0.3 inch thick. Typical dimensions of an exemplary base plate would have a diameter of about 0.45 inch for the expanded portion and about 0.41 inch for the narrower portions 11 and 17. The height would be about 0.065 inch with the smaller cylinders about 0.015 inch. The cavity would be about 0.24 inch square, at a depth of about 0.01 inch.

Usually compositions for the base plate are metals which have an elastic modulus in pounds per square inch of at least about $8 \times 10^{-6}$, more usually about $10 \times 10^{-6}$ and a yield point in units of 1,000 pounds per square inch of from about 5 to 40. Preferred metallic materials include aluminum, aluminum alloys, copper, Phosphor bronze, etc. The preferred material is aluminum or aluminum alloys which can be insulated by anodizing the surface 26 upon which the lead frame is placed. However, nonmetallic materials may be used, such as glass filled resins, thermosetting plastics, etc.

Methods of insulating the surface 26, besides anodizing, are coating the Teflon, epoxy, clad insulating materials, etc. The exposed surface 28 of the base plate may be coated or left uncoated as desired, depending on whether electrical connections would be useful to the base plate 10, or the base plate 10 should be insulated. The same method of insulation may be employed for the exposed surface, as for the surface 26 which supports the lead frame.

The lead frame 14 has a plurality of leads, the outermost leads 30 being the longest, and the innermost leads 32 being the shortest. The leads in between 30 and 32 are of varying length and are shaped so as to provide a compact device for making a plurality of electrical connections to a very small microelectronic device. The inner tips 34 of the leads define a device area 36 which is occupied by a pad 38. A pad 38 need not be present and the device would then be mounted directly on the surface 26 of the base plate 10.

For convenience in positioning and manipulation, shorting bars 40 and 42 are provided, which have positioning holes 43 for positioning in the mold die. The lead frame 14 is quite small, normally having its longest dimension of from about ½ inch to 2 inches, more usually from about ¾ inch to 1 ½ inches. The lead frame 14 rests on the base plate 10, so that the outer leads 14 extend significantly beyond the base plate.

The lead frame 14 may be composed of any electrical conducting material which can be conveniently shaped to provide the necessary leads and, optionally a pad. Preferably, the lead frame 14 and base plate 10 will have similar coefficients of expansion so that upon heating and cooling, minimal distortion of the bonds between the lead frame and the base plate occurs. In production, the lead frames are stamped from a coil of a metal sheet, so that the lead frame will usually be of a material which is malleable and may be formed in a sheet. Conductive materials which may be used include Kovar, steel, copper, brass, phosphor bronze, cupronickel, etc.

Preferably, the lead frame is protected with an insulating coating, except at the tips, both internal 34 and outer 44. Moisture resistance is enhanced by aluminization of the portion of the lead frame which is to be encapsulated, followed by anodization. Other methods of providing moisture resistance are also available, depending on the composition of the lead frame. The tips 34 may be metalized for enhancing wire bonding, either before or after forming the component housing 46.

The pad 38 provides the base for attachment of the chip or microelectronic device, not shown. Therefore, the pad 38 will normally be coated with a material to enhance attachment of the chip. Various materials, employed as preforms, include gold, gold-silicon, gold-tin eutectic, conductive epoxy, etc. In this way, an electrical connection is provided between the pad 38 and the grounded portion of the microelectronic device.

In fabricating the component housing, the base plate 10 is introduced into the lower member 48 of the mold die, the two members 48 and 52 of the mold die being separated. The base plate 10 is positioned in the mold die 18 by placing the pyramidal indentation 16 onto the pyramid 50 on the flat base of the die mold lower member 48. If the base plate 10 had a stud 20, a hole could be provided in the die mold lower member 48, which would be unthreaded and hold the stud 20 snugly, positioning the base plate 10. A locating feature could be provided, if a cavity were present in the surface 13.

Figure 6:
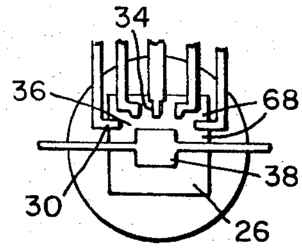
FIG. 6 is a plan view of a lead frame mounted on the base indicated in FIG. 4.
Figure 8:
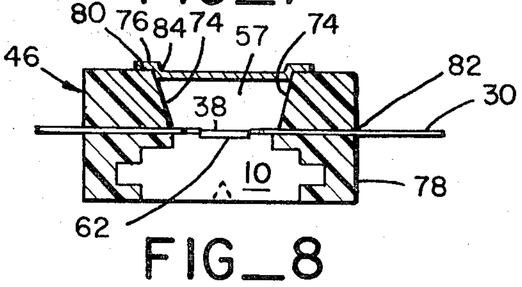
FIG. 8 is a cross-sectional view of the component housing with the nest area enclosed with a lid.
Figure 5:
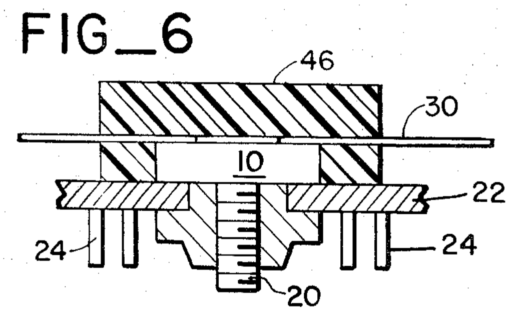
FIG. 5 is a cross-sectional view of the base of FIG. 3, mounted onto a heat dissipating housing.

The lead frame 14 is then positioned on the surface 26 of the base plate, so that the pad 38 is substantially centrally located. See FIG. 6. The pad is positioned directly over the cavity 19. The cavity is dimensioned, so as to leave about a 0.001 inch to 0.003 inch space between the side of the pad and the wall edge of the cavity. The die upper member 52 has a force 54 having a major member 56 which is shaped to provide an open nest area 57 having angularly opening walls and to leave unencapsulated the tops of the internal tips 34. The major member will be proportioned, so as to coin the lead tips 34 about 0.001 to 0.003 inch into the base plate 10. The force lower surface 58 presses down on the top of the internal tips 34.

A minor member 60 of the force extends beyond the major member 56 and has a shape substantially that of the pad 38. The function of the minor member is to press the pad 38 into the cavity 19 and then coil the pad about 0.001 to 0.003 inch into the base plate 10, forming a pad nest 62 for the pad 38. Thus, the pad 38 is rigidly positioned into the base plate 10, below the internal lead tips 34. If there is no pad, the minor member 60 either is not used or preferably is of a thickness which provides a hollow approximately the depth to which the leads 32 are coined in the base plate. The die can be designed so that the minor and major protuberances are exchangeable with different protuberances of different dimensions.

The die mold upper member 52 is positioned by the stud 64 and the die 18 introduced into a press and the two die mold members 48 and 52 locked, the force member 60 coining the pad 38 into the base plate 10. The encapsulant is forced into the die enclosure, 66, filling the enclosure and filling the interstices 68 in the lead frame 14. The encapsulatn also enters the space between the walls of the cavity 19 and the pad 38 locking the pad in position. Additional stability is provided by allowing a small amount of encapsulant to coat the corners of the pad 38. The dam 70 prevents the encapsulant from flowing into the area past the dam 70. A projection, not shown, is provided in the upper member 52 of the molding die to provide identification and act as a tooling locater.

The die members 48 and 52 are removed from the press and separated by introducing rods into the cylindrical openings 72, which force the two die members apart.

The mold die 18 is devised to provide a component housing from the encapsulant fulfilling a wide variety of functions. The major portion of the force 56 provides a nest area 57 with internal walls 74. The internal walls 74 are chamfered to permit easy entry with bonding tools and alignment of the mating lid 76. In the nest area 57, the pad 38, if present, is forced down or coined in the pad nest 62 in the base plate 10. The encapsulant is introduced in the area between the pad 38 and the inner tips 34, so as to provide a dielectric barrier between the leads 32 and the pad 38. Furthermore, the encapsulant by surrounding the pad, further locks the pad into the pad nest 62 and cavity to prevent any mechanical movement of the pad, which might disturb the pad or connecting wires. Thus, when the device is bonded to the pad 38, there is a rigid structure to maintain the pad in position and provide direct heat dissipating contact between the device, the pad 38, and the base plate 10.

The shape of the mold provides a convenient rectangular encapsulant body 78 which extends downwards in alignment with the base of the base plate and upwards above the lead frame 14, so as to provide a rigid plastic dielectric structure for the base plate 16, pad 38 and leads of the lead frame. The body 78 may be any convenient size, the size being determined by the lead frame. Usually, the body 78 will extend up to or slightly removed from the dam 70. That is, the body 78 will have a width either equal to or somewhat smaller than the distances between the dam 70. When the body 78 does not extend to the dams 70, a small amount of plastic material will be present, in the area between the wall of the housing and the dam, which is removed at the same time as the dam is removed.

In molding the housing 46, various materials may be used which have been found effective in providing a dielectric encapsulant. These materials include epoxies, silicone, phenolic molding compounds, etc. Ths significant factor in the choice of the molding compound is the ease of molding, the composition's inertness, availability, and the minimizing of trace impurities which might result in degradation of the device. However, as already indicated, this problem may be minimized by insulating a major portion of the lead frame 14.

Once the component housing 46 is removed from the mold 18, a number of minor mechanical operations are carried out. First, those portions of the lead frame 14, such as the shorting bars 40 and 42, the dams 70, and portions of the external leads 30 are removed. In addition, small amounts of plastic flash can be removed. The pad 38 which has been protected by the force member 60 may be metalized, for example with gold or other bonding agent for the microelectronic device. While normally the tops of the lead frame will have been metalized prior to formation of the component housing 46, in some instances, it may be convenient to metalize the tips 34 with gold after formation of the component housing. As desired, different portions, can be metalized differently.

It is frequently found with plastic encapsulants, that during the lift of the component, there may be moisture leakage. In order to avoid leakage, it is desirable that any voids which could permit such leakage be filled. This can be readily achieved by vacuum impregnation of the housing. The housing is introduced into a vacuum chamber, where high vacuums, as low as $10_{-}^{8}$ Torr. can be achieved. The chamber is evacuated, while the component housing is immersed in an electronic grade baking varnish. These varnishes are commercially available and are characterized by their purity and freedom from trace ionic impurities.

After sufficient time for immersion, the pressure is raised to atmospheric, resulting in the baking varnish entering any voids in the component. The enormous pressure differential, from the vacuum to atmospheric, results in complete filling of the voids by the baking varnish. The component is then washed with a suitable organic solvent to remove the varnish from the surfaces of the component housing. When the component is dry, it is then baked to cure the varnish. The baking has the additional advantage of providing a postcure for the encapsulant, enhancing the strength and stability of the encapsulant.

The component housing 46 can now be used for mounting of a lid 76 or modified to enhance sealing. Various adhesives may be used for sealing the housing area 80 in contact with the lid or the area can be metalized to enhance sealing. An alternate method of sealing is to provide a step at the top of the encapsulant body in the nest area and provide a circular lid which would sit on the step and be sealed thereto. This latter method reduces the amount of bonding agent which leaks into the nest area 57 during the sealing process.

The area 82 at the exit of the outer leads 30 can be metalized to form a coating which will provide an additional moisture barrier.

The housing 46 is now ready for the mounting of the microelectronic device and then sealing with the lid 76. The microelectronic device is situated on the pad 38 in the pad area 62 and bonded to the pad 38 by any convenient means. As already indicated, the pad 38 may be coated with gold so as to provide a conductive connection to the microelectronic device. Electrical connections are then made from the lead tips 34, by connecting gold wires or other electrical connecting means to the top of the tips 34 and to the microelectronic device. The nesting of the microelectronic device below the tips 34 allows for up bonding of electrical connections. This is preferred in order to avoid any electrical contact between the connecting wires and the device which would result in shorting with the uninsulated device surface.

The lid 76 is shaped so as to have a shoulder 84 which rests on the encapsulant body surface 80. The lid 76 is indented, so as to have a portion of the lid resting in the enclosed area 57 to permit easy positioning of the lid 76. The lid 76 can be easily sealed to the body 78 so as to provide a moisture and oxidation barrier to protect the microclectronic device from deterioration. The sealing may be carried out in an inert atmosphere, if desired. As already indicated, a flat lid may be used, where a lowered platform is provided in the encapsulant body for the lid to rest on. Other shapes or conformations could be used, as desired, for sealing the component housing.

While the discussion has been primarily concerned with the formation of a single component housing, quite obviously, by using a lead frame strip having a plurality of lead frames, a series of component housings could be molded simultaneously with appropriate design of a mold die. The strip will then come out of the mold with a series of component housings, with the leads interconnected from one lead frame to the next by small bridges 86. These bridges can be readily broken by any convenient means, at the same time that the other portions of the lead frame are removed which are no longer required.

Figure 9:
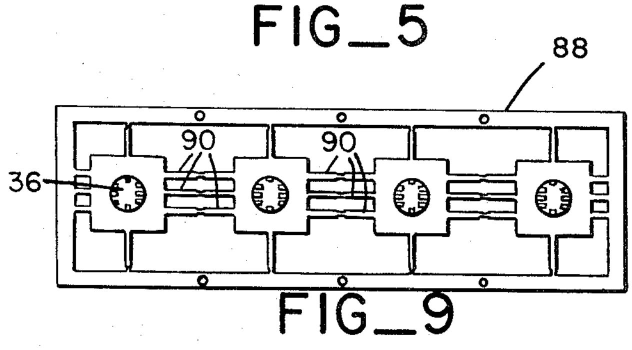
FIG. 9 is a plan view of a series of component housings.

The use of a plurality of lead frames, being molded simultaneously, is not only a question of efficiency, but can also have particular advantages, where a plurality of microelectronic devices which are interconnected are to be used. For example, a series of component housings 88 as indicated in FIG. 9, could be made simultaneously, having the desired electrical or mechanical connections 90 between the housings. Light emitting diodes could be mounted in the device area 36 and be appropriately interconnected.

One could prepare a long strip of such devices with their appropriate component housings and the final user could separate the appropriate number of housings to be used in his appliance. In this manner, whenever a series of microelectronic devices are to be employed which are to be interconnected, the appropriate lead connections present in the lead frame can be used.

By employing the component housing of this invention, numerous advantages are achieved. The subject housing provides a particularly rigid structure for the microelectronic device, providing superior package strength and reducing damage through handling by automatic equipment.

By use of a non-plastic rigid support for the lead frame, reduced attenuation of ultrasonic energy is achieved, when ultrasonic energy is used for lead attachment. In addition, the heat sink provided by the base plate and any attachments thereto, permit rapid conduction, spreading the heat over a large volume. Other advantages which have already been indicated, are the ease in accurate positioning and planarity of the die bonding pad located between the lead frame tips, the absence of any encapsulation flash in the cricital areas of die bonding, the protection against electrical shorts by the presence of an encapsulant barrier between the frame pad and the leads as well as between the individual leads, and the relative ease in the fabrication of the component housing to provide exceptionable reproductibility in the dimensions and properties of the housing.

What is claimed is:

1. A component housing comprising:

1. an independently formed metallic base member of a mildly deformable metal having an electrically insulated upper surface for supporting a lead frame;

2. resting on and coined in said upper surface in electrical isolation therefrom, a lead frame having a plurality of leads at one end extending outwardly from said base member and the other ends defining a component attach area; and 3. rigidly bonding said lead frame to said base member, an encapsulating body composed of an encapsulant composition, covering a substantial portion of said lead frame and defining a recess area leaving exposed the top portion of said leads about said component attach area and extending from between said leads and bonding said lead frame to said base member.

2. A component housing according to claim 1, wherein said lead frame has a pad located in said component attach area, and said upper surface has a cavity therein for receiving said pad, wherein said pad is coined in said cavity.

3. A component housing according to claim 1, wherein said encapsulant enclosure defines a recess having chamfered walls and extends from the recess outwardly to enclose a substantial portion of said leads.

4. A component housing according to claim 1, having a lid sealed to said encapsulating enclosure having an indented central portion for positioning said lid over said recessed area and a shoulder for sitting on said encapsulating enclosure; a microelectronic device situated in said component attach area; and electrical connecting means connecting points on said microelectronic device to said leads.

5. A component housing according to claim 4, having a stepped chamfered wall providing a platform to which said lid is sealed.

6. A component housing according to claim 1, wherein said base member is composed of aluminum.

7. A component housing according to claim 1, wherein said encapsulant enclosure extends downwardly from said lead frame, substantially surrounding said base member.

8. A component housing comprising:

1. a base member, composed substantially of aluminum, having at least one surface anodized to provide insulation, said surface having a cavity defining a component attach area;
2. resting on said anodized surface, a lead frame having a plurality of leads, one end of the leads extending outwardly beyond said base member and the other end of said leads being supported by said base member and surrounding said component attach area;
3. included in said lead frame, a pad situated in said cavity; and
4. an encapsulating enclosure recessed from said tips, the inner walls of said enclosure being chamfered and the outer walls extending over a substantial portion of said lead frame.

9. A component housing according to claim 8, wherein said lead frame is coined in said base member.

10. A component housing according to claim 8, wherein said base member is mildly deformed so as to provide a nest for said lead frame in said component attach area, and said encapsulating enclosure extends between the spaces between the leads and the space defined between the tips of said leads and said pad.

* * * * *